United States Patent [19]

Shinohara et al.

[11] Patent Number: 4,646,154
[45] Date of Patent: Feb. 24, 1987

[54] DIGITAL SUPERIMPOSED EDGE GENERATION APPARATUS

[75] Inventors: Nobutaka Shinohara; Shuji Hirakawa; Akihiko Minami; Koichi Tanaka, all of Yokohama, Japan

[73] Assignee: Tokyo Shibaura Denki Kabushiki Kaisha, Kawasaki, Japan

[21] Appl. No.: 599,614

[22] PCT Filed: Jun. 24, 1983

[86] PCT No.: PCT/JP83/00204
§ 371 Date: Apr. 3, 1984
§ 102(e) Date: Apr. 3, 1984

[30] Foreign Application Priority Data

Aug. 3, 1982 [JP] Japan ................. 57-135413

[51] Int. Cl.$^4$ ............................................. H04N 5/262
[52] U.S. Cl. ........................................ 358/183; 358/22
[58] Field of Search .................. 358/183, 22, 30, 182

[56] References Cited

U.S. PATENT DOCUMENTS 4,392,156  7/1983  Duga ................................. 358/183
4,409,618 10/1983  Inaba ................................. 358/22

FOREIGN PATENT DOCUMENTS 21763   9/1969  Japan .
111543 10/1974  Japan .
42330  10/1977  Japan .
46668  11/1977  Japan .
21812   7/1978  Japan .

Primary Examiner—Tommy P. Chin
Attorney, Agent, or Firm—Cushman, Darby & Cushman

[57] ABSTRACT

A vertical edge width calculation circuit 31 has a plurality of series-connected delay circuits 31a to 31h each having a one-horizontal period delay time. A horizontal edge width calculation circuit has a plurality of 1-pixel delay circuits 32a to 32h corresponding to the edge width. A horizontal distance between an input digital superimpose key signal and a raster position is calculated in accordance with the calculated vertical distance, that is, the edge width. In accordance with the calculated vertical and horizontal distances, a detection circuit 34 detects as a true Euclidean distance a minimum value among a plurality of Euclidean distances between the digital superimpose key signal and the raster position which are stored in ROMs $33_0$ to $33_5$.

10 Claims, 8 Drawing Figures

| i \ dHi | 0 | 1 | 2 | 3 | 4 |
|---|---|---|---|---|---|
| 0 | 0 | 1 | 2 | 3 | 4 |
| 1 | 1 | 1.41 | 2.24 | 3.16 | 4.12 |
| 2 | 2 | 2.24 | 2.83 | 3.61 | 4.47 |
| 3 | 3 | 3.16 | 3.61 | 4.24 | 5 |
| 4 | 4 | 4.12 | 4.47 | 5 | 5 |

| | | | | | | | |
|---|---|---|---|---|---|---|---|
| 5 | 5 | 5 | 5 | 5 | 5 | 5 | 5 |
| 4 | 4 | 4 | 4.12 | 4.47 | 5 | 5 | 5 |
| 3 | 3 | 3 | 3.16 | 3.61 | 4.24 | 5 | 5 |
| 2 | 2 | 2 | 2.24 | 2.83 | 3.61 | 4.47 | 5 |
| 1 | 1 | 1 | 1.41 | 2.24 | 3.16 | 4.12 | 5 |
| 0 | 0 | 0 | 1 | 2 | 3 | 4 | 5 |
| 0 | 0 | 0 | 1 | 2 | 3 | 4 | 5 |
| 0 | 0 | 0 | 1 | 2 | 3 | 4 | 5 |

$S_k$

DIGITAL SUPERIMPOSED EDGE GENERATION APPARATUS

TECHNICAL FIELD

The present invention relates to a digital superimposed edge generation apparatus which adds an edge of a predetermined width to a superimposed image of a television equipment.

BACKGROUND ART

As is well known, digital processing techniques of television signals have rapidly advanced, and various types of apparatuses now used are of digital type. This tendency to use digital circuitry applies also to a superimposed edge generation apparatus when high performance digital processing is required.

FIG. 1 shows a conventional digital superimposed edge generation apparatus. A digital superimpose key signal $S_K$ generated by a predetermined inserted image is supplied to a V (vertical) direction edge addition circuit 11. The edge addition circuit 11 adds an edge of a predetermined width in the vertical direction of the key signal. The V direction edge addition circuit 11 produces a V direction edge signal $E_V$ and the superimpose key signal $S_K$ which is delayed by a predetermined time. The delayed superimpose key signal $S_K$ from circuit 11 is supplied to an H (horizontal) direction edge addition circuit 12. The edge addition circuit 12 adds an edge of a predetermined width (determined from the superimpose key) in the horizontal direction of the key signal. The circuit 12 produces an H direction edge signal $E_H$. The H direction edge signal $E_H$ and the vertical edge signal $E_V$ are supplied to a correction circuit 13. The correction circuit 13 multiplies the edge signals $E_H$ and $E_V$ so as to correct the width of the edge at a corner of the key signal to a predetermined width. In a digital superimposed edge generation apparatus of this type, processing in the H and V directions are performed independently of each other and the relationship between the edges in the H and V directions is corrected afterwards. Therefore, it is possible to add an edge of a predetermined width to a key signal of H or V direction. However, correction procedures become complex for a key signal of a recessed shape, and it is difficult to add an edge of a predetermined width to such a signal.

When an edge is to be added to a circular key signal K as shown in FIG. 2, the edge width becomes narrower in directions l1 and l2 of 45° than in the H and V directions. This occurs because the edge signals in the H and V directions are calculated first, and then the edge signals in the l1 and l2 directions are obtained by multiplying the obtained signals. Thus, in a conventional apparatus, it is difficult to generate an edge of a constant width depending upon the shape of a key signal, resulting in an unnatural appearance.

The present invention has been made in consideration of this and has for its object to provide a digital superimposed edge generation apparatus which is capable of generating an edge of a constant width irrespective of the shape of a key signal.

SUMMARY OF THE INVENTION

According to the present invention, a Euclidean distance between a raster position and a superimpose key signal at a given time is calculated in real time, and an edge is generated in accordance with the calculated distance, thereby generating an edge of a constant width and of natural appearance.

According to the present invention, there is provided a digital superimposed edge generation apparatus wherein since the raster position and the superimpose key signal at a given time can be obtained in real time and an edge is generated in accordance with the calculated distance, an edge of a constant width can be generated irrespective of the shape of a superimpose key signal and an edge of a natural appearance can be added.

BEST MODE OF CARRYING OUT THE INVENTION

The preferred embodiment of the present invention will be described with reference to the accompanying drawings. The maximum edge width in the case to be described below is 4H.

Figure 1:
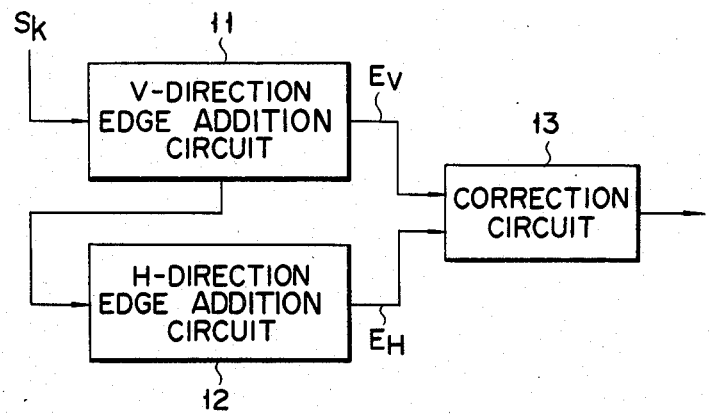
FIG. 1 is a block diagram showing the configuration of an example of a conventional digital superimposed edge generation apparatus.
Figure 2:
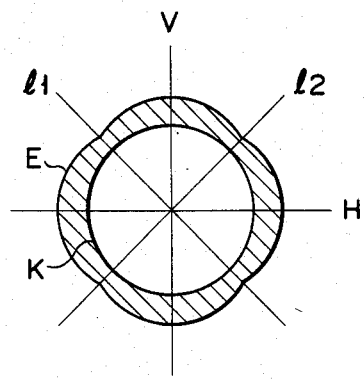
FIG. 2 is a representation showing an example of a superimposed image according to the apparatus shown in FIG. 1.
Figure 3:
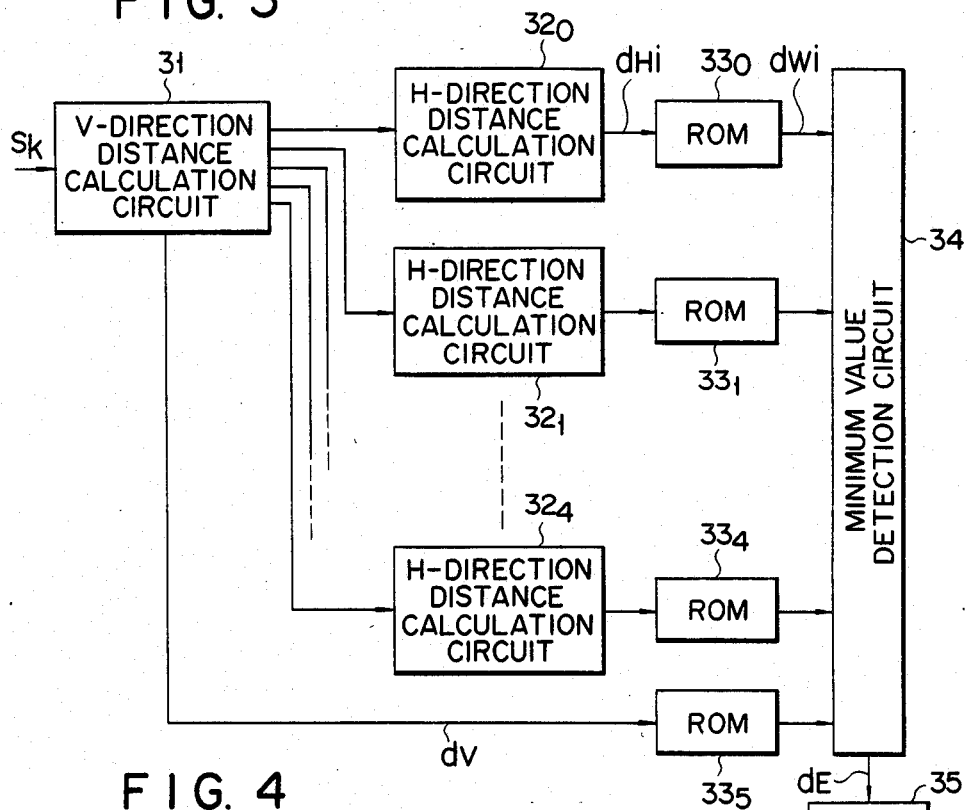
FIG. 3 is a block diagram showing an embodiment of a digital superimposed edge generation apparatus according to the present invention.
Figure 4:
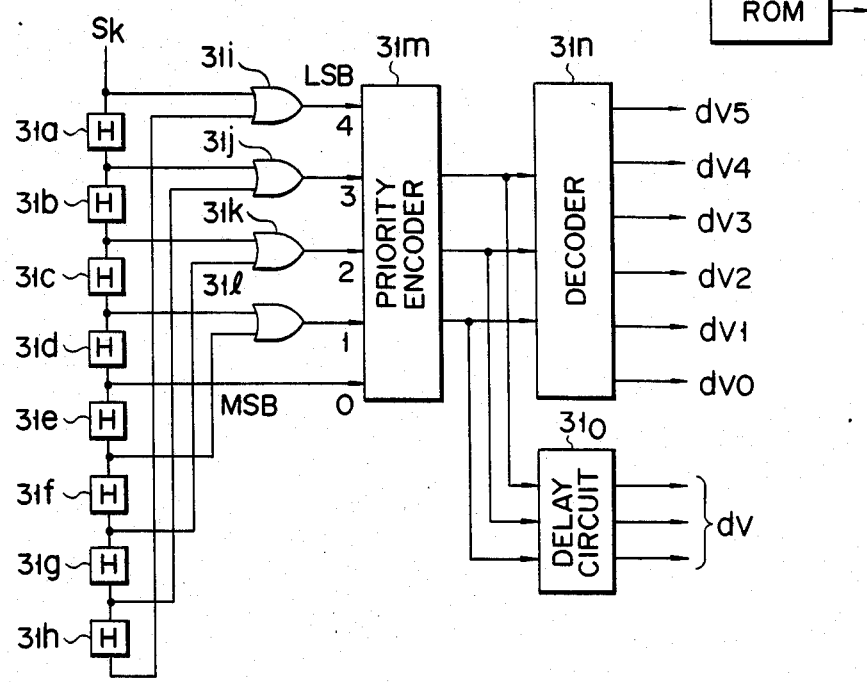
FIG. 4 is a block diagram showing the circuit configuration of a V direction distance calculation circuit shown in FIG. 3.

Referring to FIG. 3, a digital superimpose key signal $S_K$ is first supplied to a V (vertical) direction distance calculation circuit 31. The circuit 31 calculates a distance between the key signal $S_K$ and a raster position in the V direction. The calculation circuit 31 has a configuration as shown in FIG. 4. The key signal $S_K$ is supplied to series-connected delay circuits (H) 31a and 31b to 31h. The delay circuits 31a and 31b and 31h have a one-H period delay time and sequentially delay the key signal $S_K$. The key signal $S_K$ and an output signal from the last delay circuit 31h are supplied to an OR circuit 31i. Output signals from the delay circuits 31a and 31g are supplied to an OR circuit 31j. In a similar manner, output signals from the delay circuits 31b and 31f, and output signals from the delay circuits 31c and 31e, are respectively supplied to OR circuits 31k and 31l. In FIG. 4, the output of delay circuit 31d represents a four pixel period delay. Since this is the maximum edge distance in this embodiment, this output is a center or reference position between +4 pixels and −4 pixels. This is used for detecting the distance of the superimpose key signal from the raster position in a positive or negative direction with respect to this center position. For example, when "1" signal is output from OR circuit 31i, the position of the superimpose key signal is then known to be $+4 \times H$ or $-4 \times H$ from the raster position in the vertical direction. Output signals from the OR circuits 31i to 31l and output signals from the delay circuit 31d are supplied to a priority encoder 31m. In the priority encoder 31m, the priority is set in the order of the MSB to the LSB of the inputs. When a signal "1" is supplied to an input terminal of higher priority, the priority encoder 31m produces a signal corresponding to this input terminal. For example, when signals of level "1" are supplied to input terminals 1 and 2, the priority encoder 31m produced a 3-bit vertical direction distance signal dV "001" corresponding to the number of the input terminal 1 having the higher priority. The input terminals of the priority encoder 31m of higher priority correspond to smaller distances to the key signal. When a "1" signal is delivered from any one of OR circuits 31i to 31, the priority encoder 31m outputs an output signal representing a distance in the vertical direction. When the superimpose key signal is at the raster position, the output from encoder 31m is "000", and if a distance of 1H from the raster position, "001" is output. If distanced by 2H, "010" is obtained, if distanced by 3H, "011" is delivered and if distanced by 3H, "100" is obtained. The distance signal dV is supplied to a decoder 31n and to a delay circuit 31o having a delay time corresponding to 4 dots (pixels). The decoder 31n selects an H direction distance calculation circuit, to be described later, and has output terminals dV0 to dV5. In accordance with the input signal, the decoder 31n produces a signal of level "1" to a single output terminal and supplies a signal of level "0" to all the remaining output terminals. When a signal "001", for example, is supplied, only the output terminal dV1 is set at level "1", and the remaining output terminals are all set at level "0". When there is no key signal input, only the output terminal dV5 is set at level "1".

In this decoder 31n, when the key signal Sk of "1" appears in the raster position, an output of "1" is obtained at the output terminal dV0, and the distance from the edge of the key signal $S_K$ to a raster vertically upward or downward therefrom is obtained as output signals from the output terminals dV1 to dV4. The output terminals dV0 to dV4 of the decoder 31n are respectively connected to H (horizontal) direction distance calculation circuits 31o and 31₁ to 32₄, as shown in FIG. 3. The H direction distance calculation circuits 32₀ and 32₁ to 32₄ are selectively energized by output signals from the decoder 31n and calculate the distance between the key signal and raster position in the horizontal direction. The circuits 32₀ to 32₁ to 32₄ have the configuration as shown in FIG. 5.

Figures 5, 6:
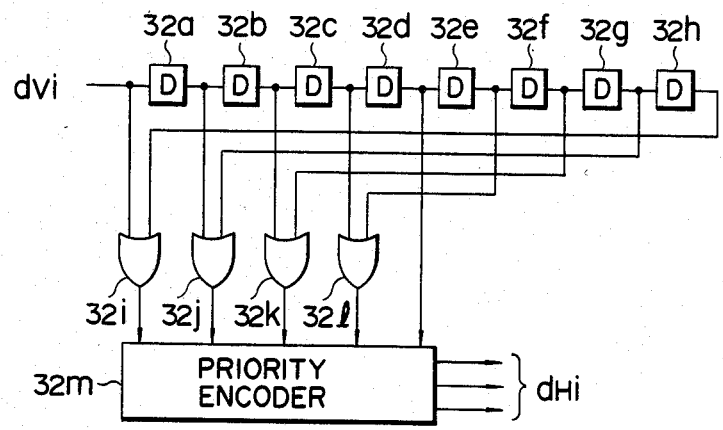
FIG. 5 is a block diagram showing the circuit configuration of an H direction distance calculation circuit shown in FIG. 3.
FIG. 6 shows the memory contents of a ROM shown in FIG. 3, and FIGS. 7 and 8 are a table and a representation for explaining the mode of operation of the apparatus shown in FIGS. 3 to 5.

Referring to FIG. 5, output signals dVi (i=0 to 4) from the decoder 31n are supplied to series-connected delay circuits 32a and 32b to 32h. The delay circuits 32a and 32b to 32h respectively have a delay time corresponding to one dot (pixel). The output signal dVi from the decoder 31n are sequentially delayed by the delay circuits 32a and 32b to 32h. The output signal dVi from the decoder 31n and the output signal from the delay circuit 32h are supplied to an OR circuit 32i. Output signals from the delay circuits 32a and 32g are supplied to an OR circuit 32j. Similarly, output signals from the delay circuits 32b and 32f, and output signals from the delay circuits 32c and 3e, are respectively supplied to OR circuits 32k and 32l. Output signals from the OR circuits 32i to 32l and an output signal from the delay circuit 32d are supplied to a priority encoder 32m. The output of delay circuit 32d is used as a reference for determining the horizontal distance from the center or edge position to the raster position, similar to as used in delay circuit 31d. The priority encoder 32m operates in a similar manner to that of the priority encoder 31m described above. 3-bit H direction distance signals dHi (i=0 to 4) having values of 0 to 5 are produced from the output terminal of the priority encoder 32m. Signals dH0 and dH1 to dH4 are produced from the H direction distance calculation circuits 32₀ and 32₁ to 32₄, respectively. These signals indicate the distance of the raster from the edge of the key signal in the horizontal direction.

A Euclidean distance dWi between a key signal and a raster position at a given time is calculated from the output signals dHi (i=0 to 4) from the H direction distance calculation circuits 32₀ and 32₁ to 32₄ as follows:

$$dWi = \sqrt{dHi^2 + i^2} \, (i=0 \text{ to } 4) \quad (1)$$

This is performed using a high-speed ROM (read-only memory). More specifically, the H direction distance signals dHi from the H direction distance calculation circuits 32₀ and 32₁ to 32₄ are supplied to ROMs 33₀ and 33₁ to 33₄. These ROMs 33₀ and 33₁ to 33₄ are addressed by the distance signals dHi. The ROMs 33₀ and 33₁ to 33₄ store the values of the Euclidean distance dWi as shown in FIG. 6. That is, the ROM 33₀ stores the values corresponding to i=dVi=0, and the ROM 33₁ stores the values corresponding to i=1. Similarly, the remaining ROMs 33₂ to 33₄ respectively store the values corresponding to i=2, 3 and 4. Accordingly, when the ROMs 33₀ and 33₁ to 33₄ are addressed by the distance signals dHi, the Euclidean distance between the key signal $S_K$ and the raster position at a given time can be calculated. In this embodiment, since the maximum edge width is 4H, the values of the Euclidean distance dWi exceeding 5 can be regarded as 5.

Thus, it can be readily seen by those of ordinary skill in the art that the Euclidean distance is calculated as being the hypotenuse of the triangle whose sides are defined by the vertical and horizontal distances.

A 4-dot delayed V direction distance signal dV from the V direction distance calculation circuit 31 is supplied to a ROM 33₅. The ROM 33₅ stores the values corresponding to dHi=0, as shown in FIG. 6, and these values are read out upon being addressed by the distance signal dV.

Since the H direction distance calculation circuits 32₀ to 32₄ respectively have delay circuits, they simultaneously produce five H direction distance signals. Accordingly, the ROMs 33₀ and 33₄ addressed by these H direction distance signals also produce five distance signals dWi. Accordingly, the minimum value among these distance signals dWi and the V direction distance signals described above is the true Euclidean distance dE between the raster position and the key signal of "1". This distance is given by:

$$dE = MIN[dWi, dV] \, i=0 \text{ to } 4 \quad (2)$$

In practice, output signals from the ROMs 33₀ to 33₅ are supplied to a minimum value detection circuit 34 which produces a minimum value of the input values. An output signal from the minimum value detection circuit 34, that is, the true Euclidean distance dE between the raster position and the key signal at a given time, is supplied to a ROM 35 and is converted into a brightness level corresponding to the distance. The ROM 35 stores the brightness level signals corresponding to various distances, and a brightness level signal corresponding to the distance dE is addressed thereby and is read out. The readout brightness level signal is mixed with a delayed inserted image (not shown) and an edge is added around this image. Either a soft or hard edge can be added to the inserted image by suitably changing the brightness level signal in accordance with the distance.

Figures 7, 8:
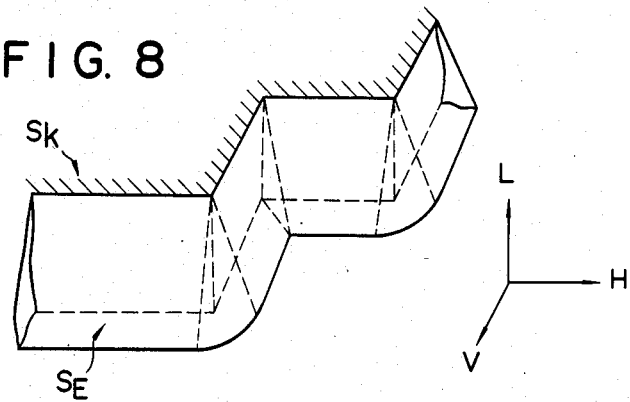

FIG. 7 shows the Euclidean distance between the raster position and the key signal $S_K$, which is obtained using the apparatus as described above.

FIG. 8 stereoscopically shows a case wherein a soft edge $S_E$ is added to a key signal $S_K$ with a three-dimensional pattern using the apparatus described above. Referring to FIG. 8, reference symbol L denotes a brightness level. In this apparatus, an edge of a constant width can be added to a key signal of a complex shape.

In the embodiment described above, values corresponding to distance information are stored in the ROMs $33_0$ to $33_5$. However, similar advantages can be obtained if values corresponding to brightness levels are stored therein. However, in this case, the minimum value detection circuit 34 must be replaced with a maximum value detection circuit, and the ROM 35 is omitted.

Various changes and modifications can be made within the spirit and scope of the present invention.

Industrial Applicability

A digital superimposed edge generation apparatus of the present invention digitally adds an edge of a constant width to a superimposed image irrespective of the shape of the key signal, and can be effectively used for commercial or information processing television receivers.

What is claimed is:

1. A digital superimposed edge generation apparatus comprising:
    means for obtaining a vertical distance between an input digital superimpose key signal and a raster position, said vertical distance obtaining means including a plurality of one horizontal period delay means for delaying the digital superimpose key signal by a period of one raster scan in the horizontal direction, each of horizontal period delay means being serially connected with each other;
    means for obtaining a horizontal distance between the digitial superimpose key signal and the raster position in correspondence with the vertical distance obtained from said vertical distance obtaining means, said horizontal distance obtaining means having a plurality of serially connected 1-pixel delay means for delaying the key signal delayed by the vertical distance obtaining means by a period corresponding to one picture element dot; and
    means for obtaining a Euclidean distance between the digital superimpose key signal and the raster position based on the values of the vertical and horizontal distances.

2. An apparatus according to claim 1, wherein the Euclidean distance obtaining means includes a plurality of first read-only-memories or ROMs, each of which stores values of the Euclidean distance corresponding to a horizontal direction distance signal used to access the first ROMs, a second ROM for storing a plurality of Euclidean distances corresponding to a vertical direction distance signal used to access the second ROM, and minimum value detection means coupled to outputs of the first and second ROMs for detecting a minimum input value so as to obtain a true Euclidean distance.

3. An apparatus according to claim 1, wherein said vertical distance obtaining means further includes a first priority encoder having bit inputs including a most significant bit and a least significant bit, the most significant bit being connected to an output of a center delay circuit in the horizontal period delay circuits and the least significant bit input being connected to an output of an OR circuit which has a first input connected to an input side of the first horizontal period delay means and a second input connected to an output side of a last one of the horizontal period delay means; and
    said horizontal distance obtaining means further including a second priority encoder having at least a most significant bit input and a least significant bit input, the most significant bit input being connected to an output side of the center delay circuit in the one-pixel delay circuits and the least significant bit input being connected to an output of an OR circuit having two inputs respectively connected to an input side of a first one and an output side of a last one of the one-pixel delay circuits.

4. An apparatus as in claim 1 wherein said Euclidean distance is a hypotenuse of a triangle whose sides are formed by the vertical and horizontal distances.

5. A digital superimposed edge generation apparatus for superimposing a key signal and a raster signal, comprising:
    means, for obtaining a vertical distance between the key signal and the raster signal;
    means, coupled to said vertical distance obtaining means, for obtaining a horizontal distance between the key signal and the raster signal; and
    calculating means, coupled to said vertical and horizontal distance obtaining means, for obtaining a superimposed edge represented by a hypotenuse of the triangle formed with sides being said horizontal and said vertical distances, by applying the mathematical formula $H = A^2 + B^2$, where H is the hypotenuse and A and B are the triangle sides.

6. An apparatus as in claim 5,
    wherein said vertical distance obtaining means include a plurality of horizontal period delay means for delaying the key signal by a period of one horizontal scan, said horizontal period delay means being connected in series with one another to thereby produce a plurality of successive horizontally delayed key signals;
    and wherein said horizontal distance obtaining means is coupled to said successive horizontally delayed key signals and further comprises a plurality of serially connected one-pixel delay means for delaying the successive horizontally delayed key signals from said horizontal period delay means by a period of one pixel.

7. An apparatus as in claim 6 further comprising a plurality of means for obtaining a superimposed edge represented by said hypotenuse of the triangle formed with sides being said horizontal and vertical distances; and
    minimum value detection means coupled to said plurality of super imposed edge obtaining means for detecting a minimum input value which indicates a true calculated hypotenuse distance.

8. An apparatus as in claim 5 wherein said means for obtaining a superimposed edge includes at least one memory means for storing and retrieving data from a plurality of addresses, each said address representing a pair of said horizontal and vertical distances which form the sides of said triangle, and the data corresponding to said each address being a precalculated hypotenuse value corresponding to the triangle formed.

9. An apparatus as in claim 6 wherein said means for obtaining a superimposed edge includes at least one memory means for storing and retrieving data from a plurality of addresses, each said address representing a pair of said horizontal and vertical distances which form the sides of said triangle, and the data corresponding to said each address being a precalculated hypotenuse value corresponding to the triangle formed.

10. An apparatus as in claim 7 wherein said means for obtaining a superimposed edge includes at least one memory means for storing and retrieving data from a plurality of addresses, each said address representing a pair of said horizontal and vertical distances which form the sides of said triangle, and the data corresponding to said each address being a precalculated hypotenuse value corresponding to the triangle formed.

* * * * *